(12) United States Patent
Pyo

(10) Patent No.: US 12,302,520 B2
(45) Date of Patent: May 13, 2025

(54) DISPLAY DEVICE

(71) Applicant: LG ELECTRONICS INC., Seoul (KR)

(72) Inventor: Jonggil Pyo, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 215 days.

(21) Appl. No.: 18/030,393

(22) PCT Filed: Oct. 6, 2020

(86) PCT No.: PCT/KR2020/013588
§ 371 (c)(1),
(2) Date: Apr. 5, 2023

(87) PCT Pub. No.: WO2022/075496
PCT Pub. Date: Apr. 14, 2022

(65) Prior Publication Data
US 2023/0380091 A1 Nov. 23, 2023

(51) Int. Cl.
*H05K 5/03* (2006.01)
*H05K 5/02* (2006.01)

(52) U.S. Cl.
CPC .............. *H05K 5/03* (2013.01); *H05K 5/0221* (2013.01)

(58) Field of Classification Search
None
See application file for complete search history.

(56) References Cited

U.S. PATENT DOCUMENTS

| 9,863,586 | B2* | 1/2018 | Yang | F21K 9/20 |
| 10,373,535 | B2* | 8/2019 | Hall | G06F 1/183 |
| 2006/0278215 | A1* | 12/2006 | Gagas | F24C 15/2092 |
| | | | | 126/299 D |
| 2009/0015997 | A1* | 1/2009 | Barajas | G09F 9/33 |
| | | | | 361/679.27 |

FOREIGN PATENT DOCUMENTS

| CN | 211475350 U | 9/2020 |
| KR | 10-2015-0081225 A | 7/2015 |
| KR | 10-2019-0092980 A | 8/2019 |
| KR | 10-2020-0054062 A | 5/2020 |
| WO | WO 2020/196996 A1 | 10/2020 |

* cited by examiner

*Primary Examiner* — Xanthia C Relford
*Assistant Examiner* — Xanthia C Cunningham
(74) *Attorney, Agent, or Firm* — Birch, Stewart, Kolasch & Birch, LLP

(57) ABSTRACT

A display device is disclosed. The display device of the present disclosure includes: a display panel; a frame to which the display panel is mounted; a cover disposed at a front of the display panel and movably coupled to the frame; and a lift assembly mounted at the frame and configured to move the cover, wherein the lift assembly includes: a lead screw elongated in a moving direction of the cover; a holder adjacent to one end of the lead screw; a slider coupled to the cover and moving along the lead screw when the lead screw rotates; and a fixing ring which is coupled to the slider and through which the lead screw passes, the fixing ring facing the holder in a longitudinal direction of the lead screw, and removably inserted into the holder.

13 Claims, 18 Drawing Sheets

[FIG. 1]
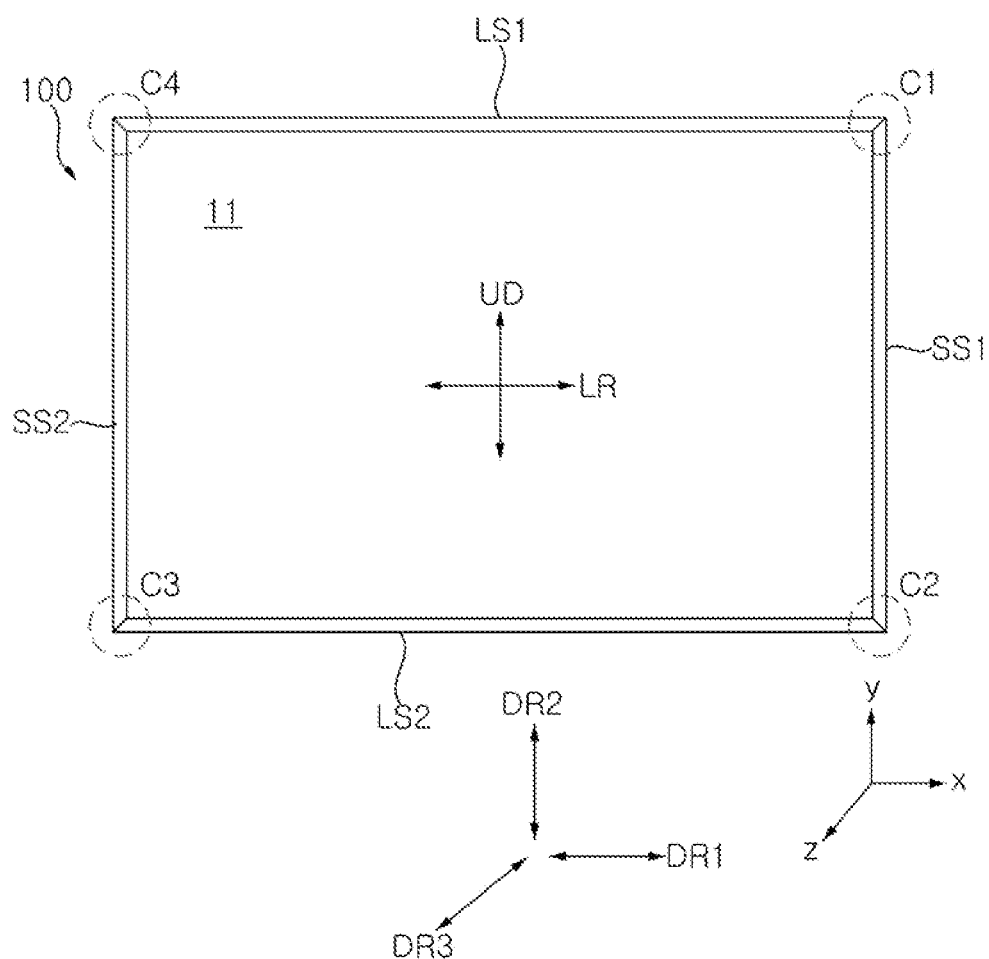

[FIG. 2]
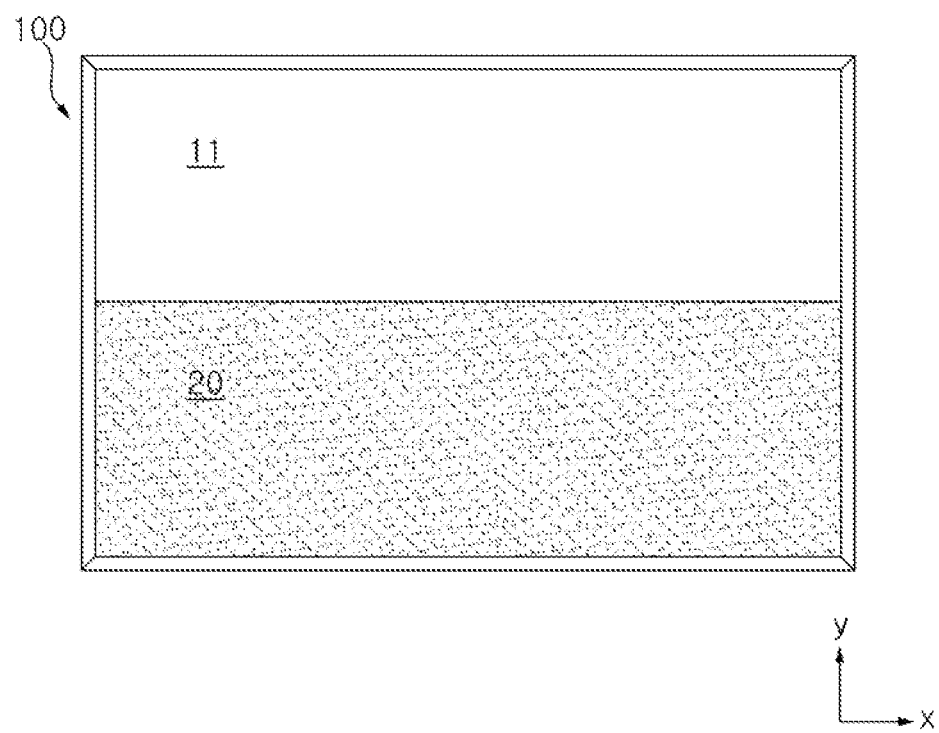

[FIG. 3]
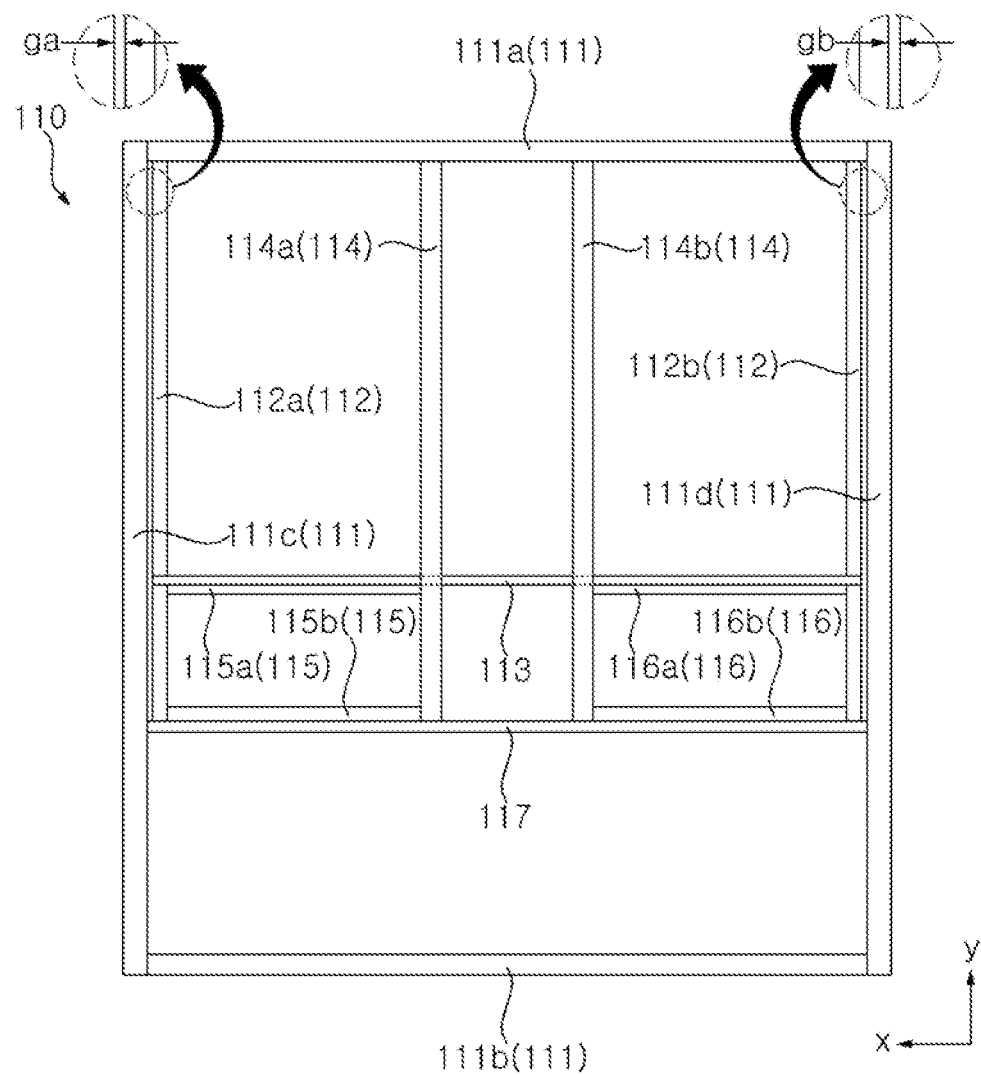

[FIG. 4]
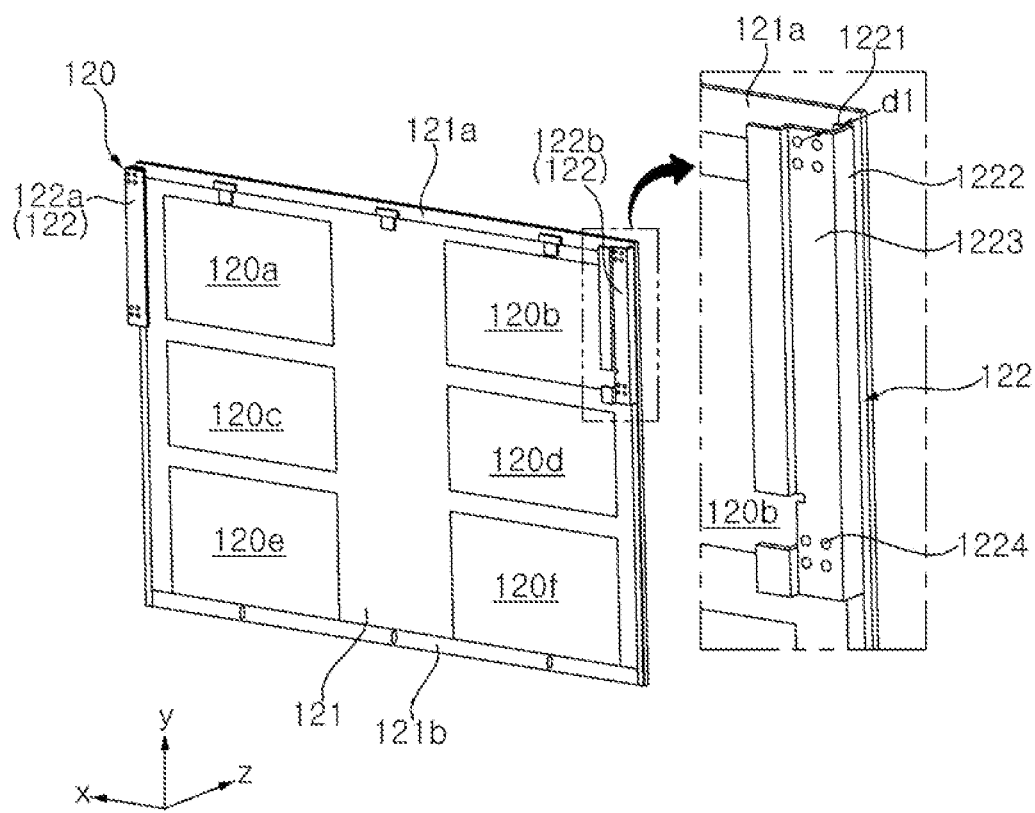

[FIG. 5]
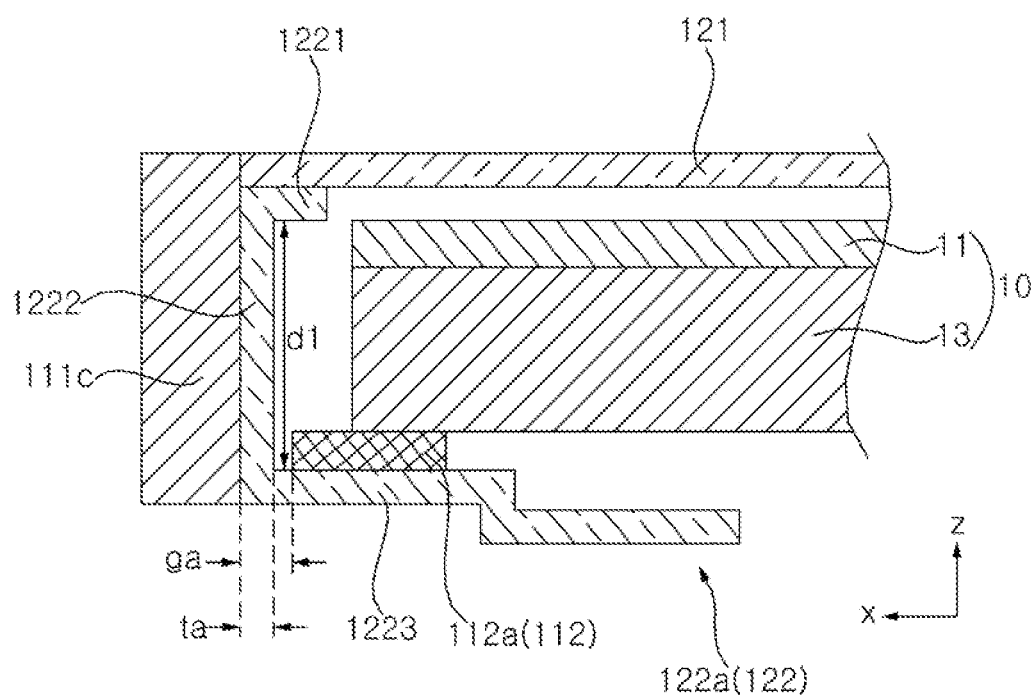

[FIG. 6]
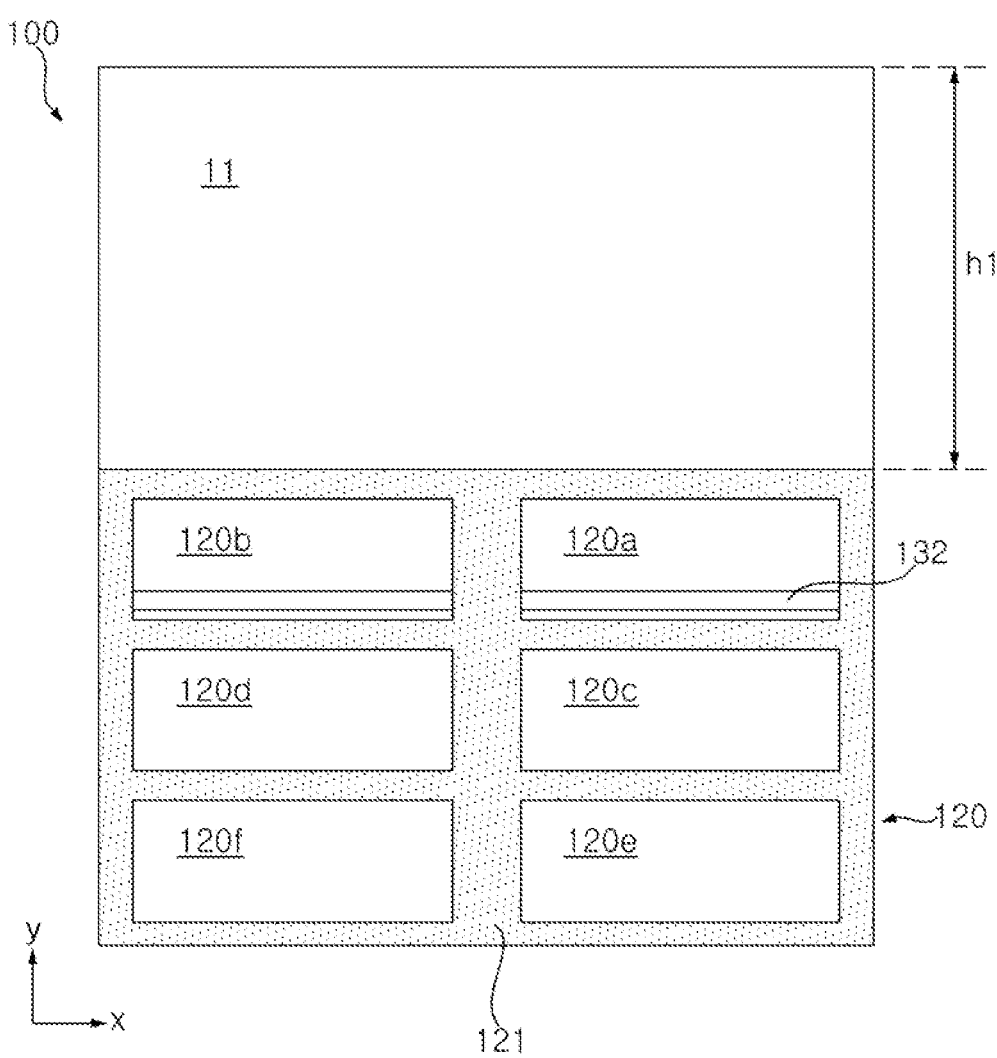

[FIG. 7]
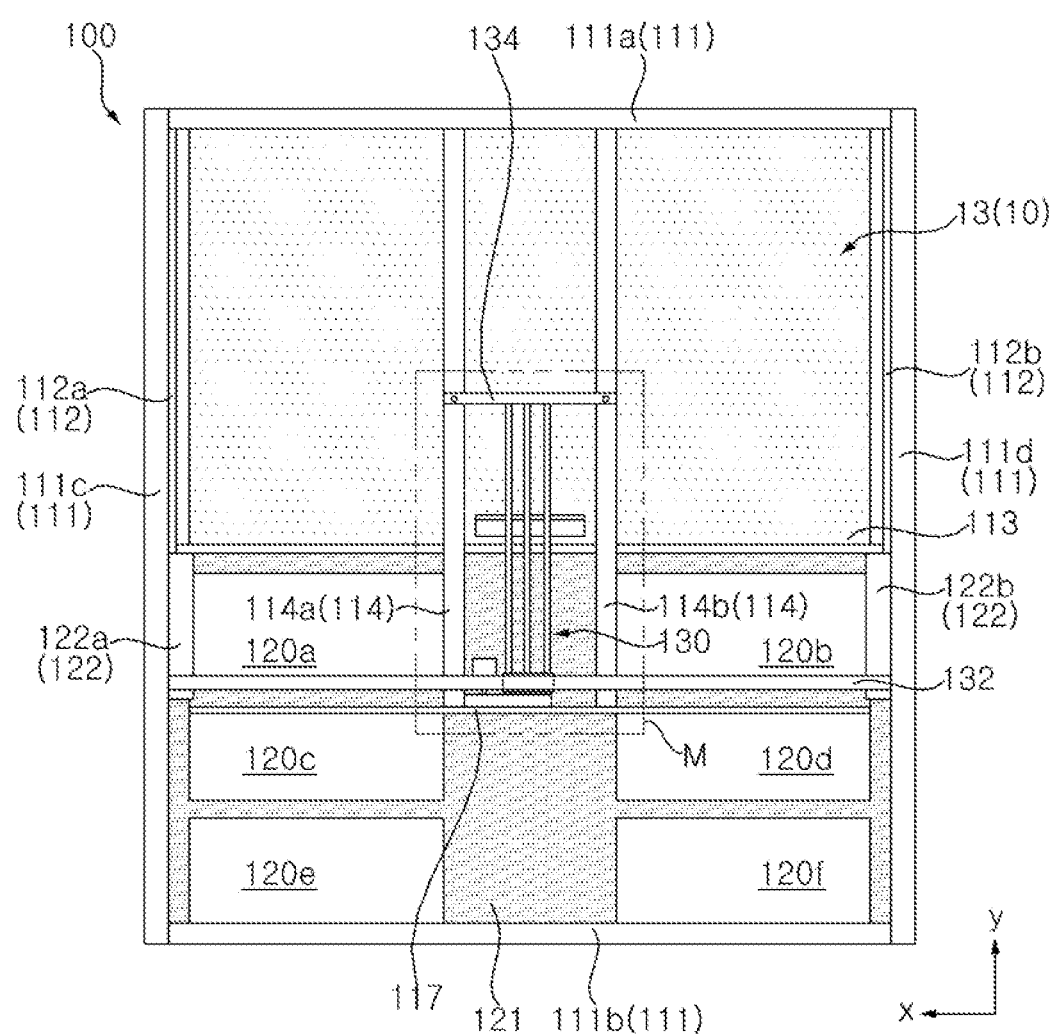

[FIG. 8]
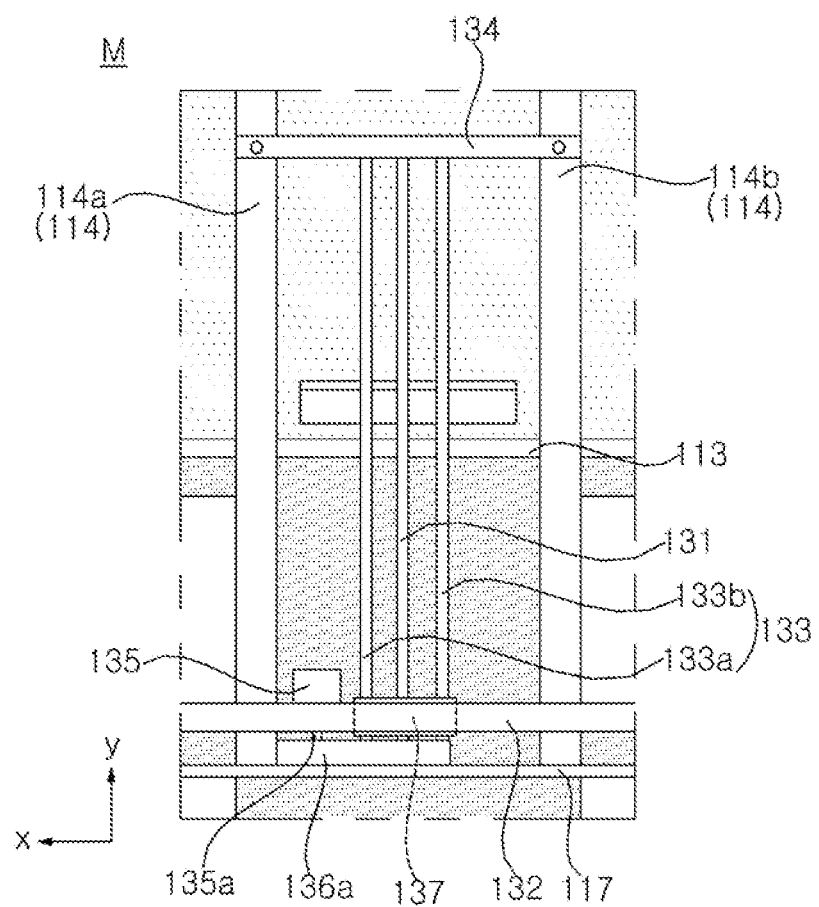

[FIG. 9]
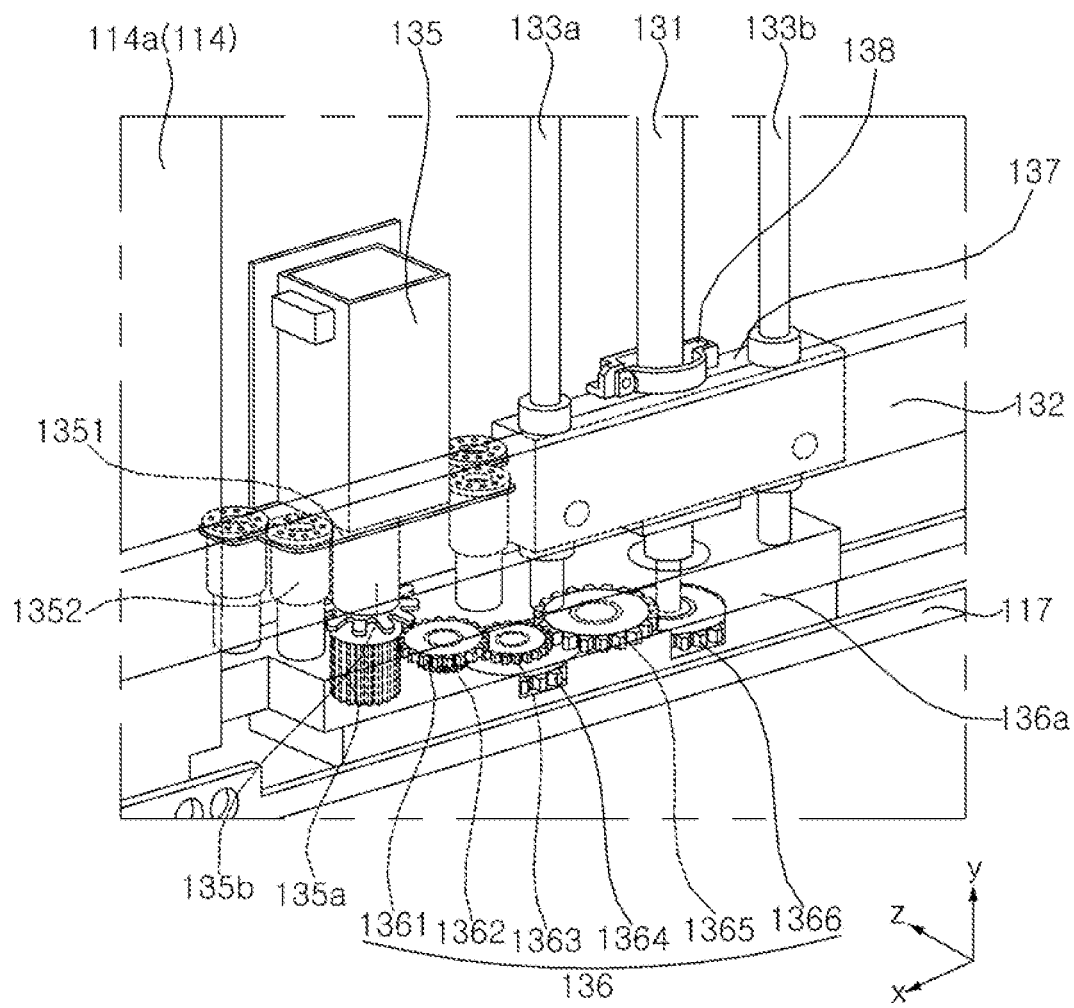

[FIG. 10]
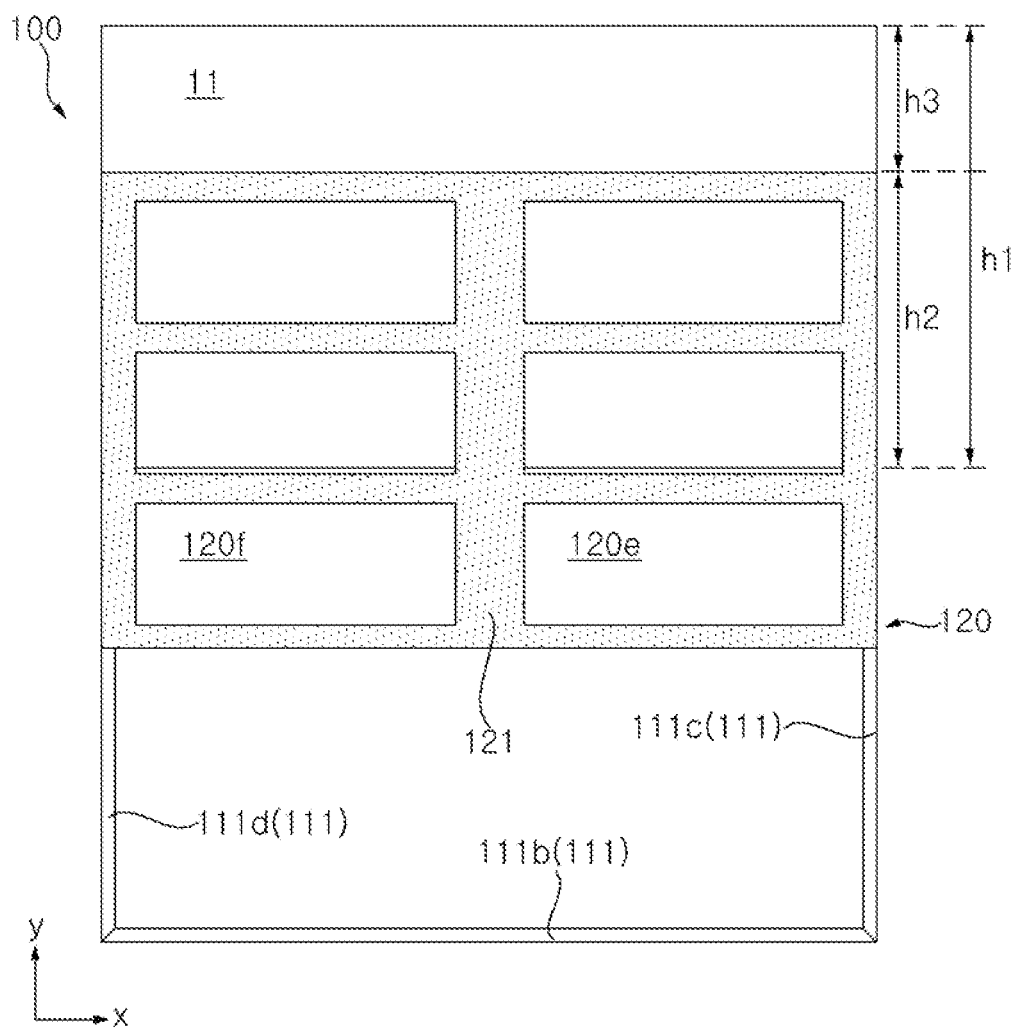

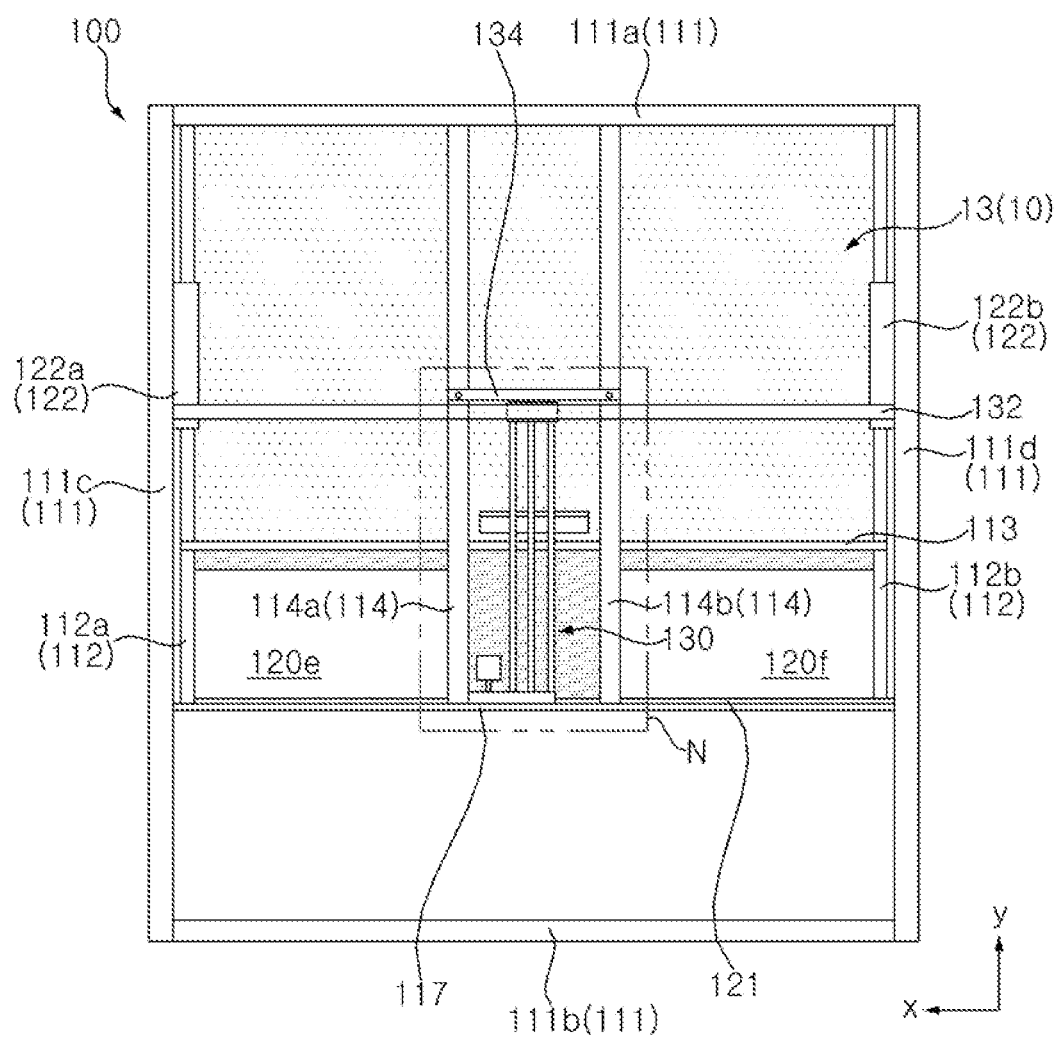
[FIG. 11]

[FIG. 12]
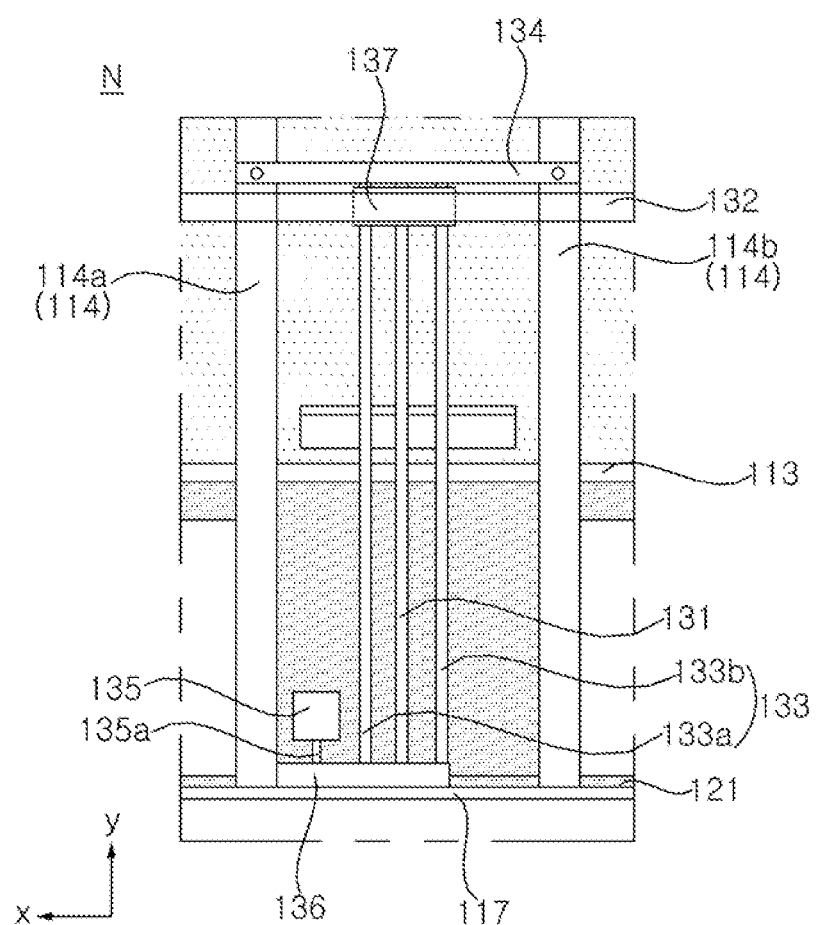

[FIG. 13]
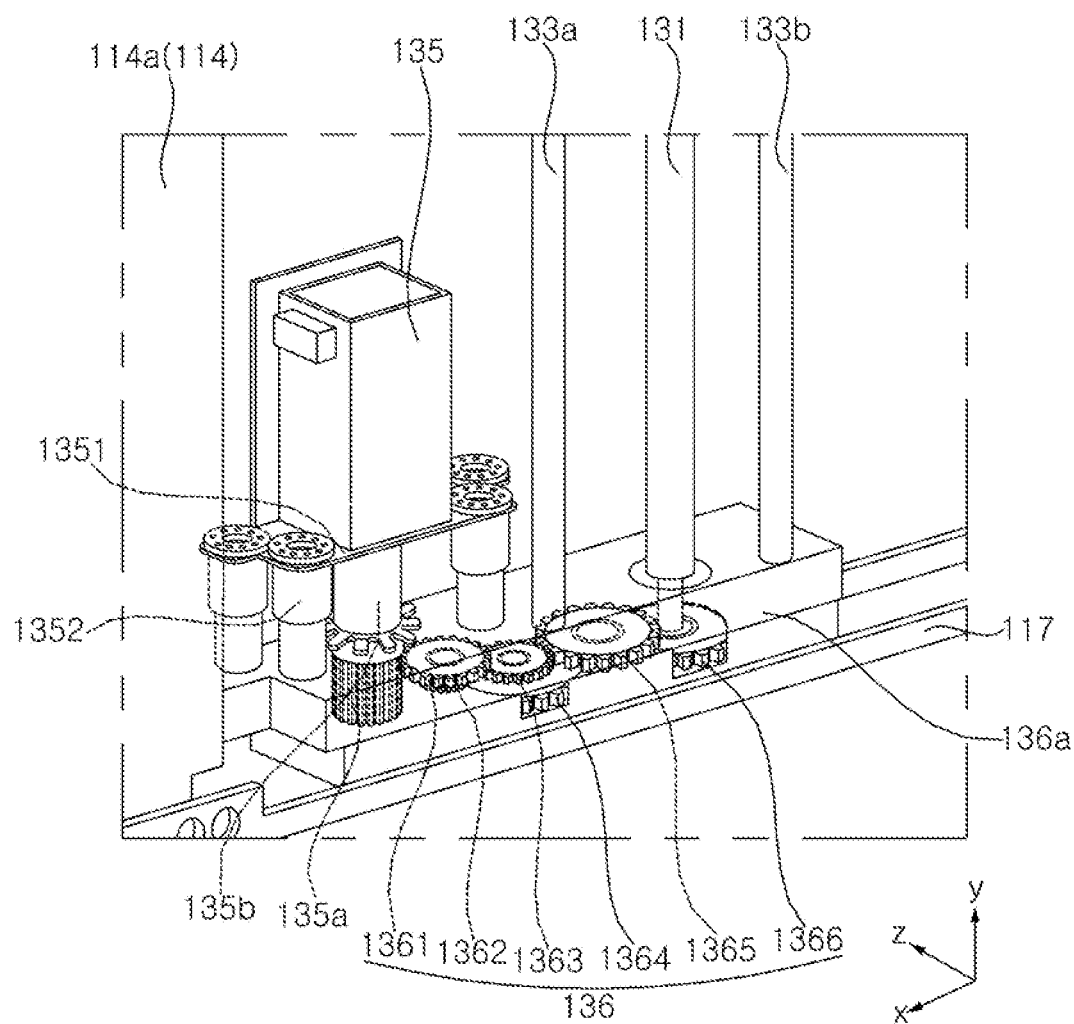

[FIG. 14]
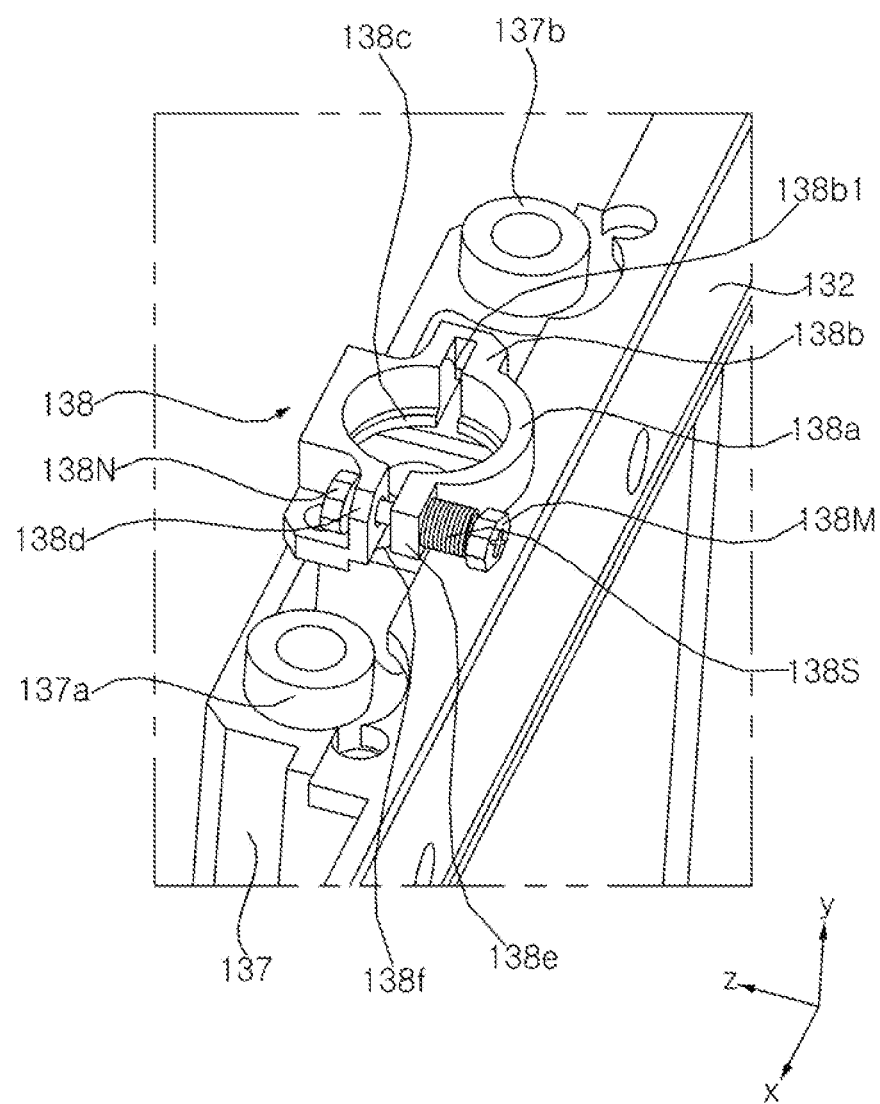

[FIG. 15]
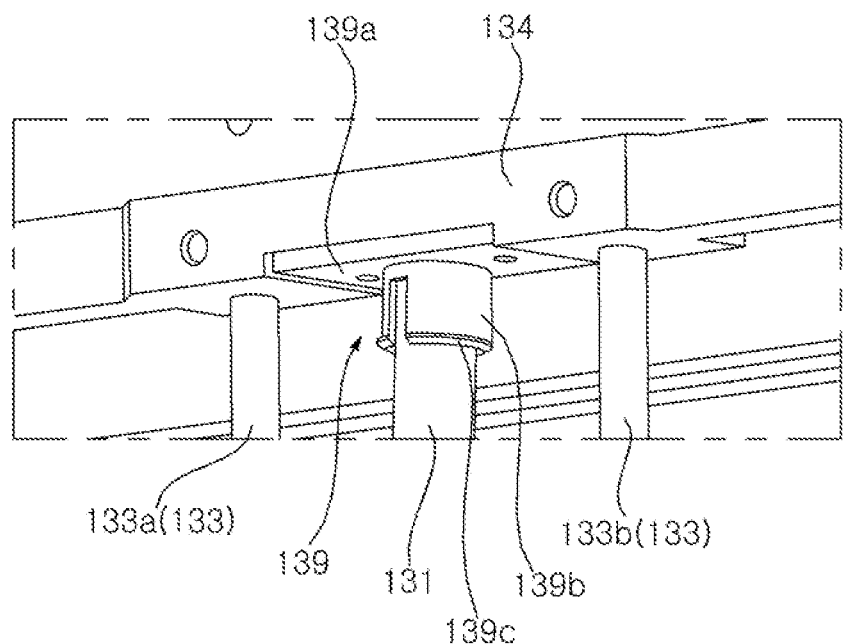

[FIG. 16]
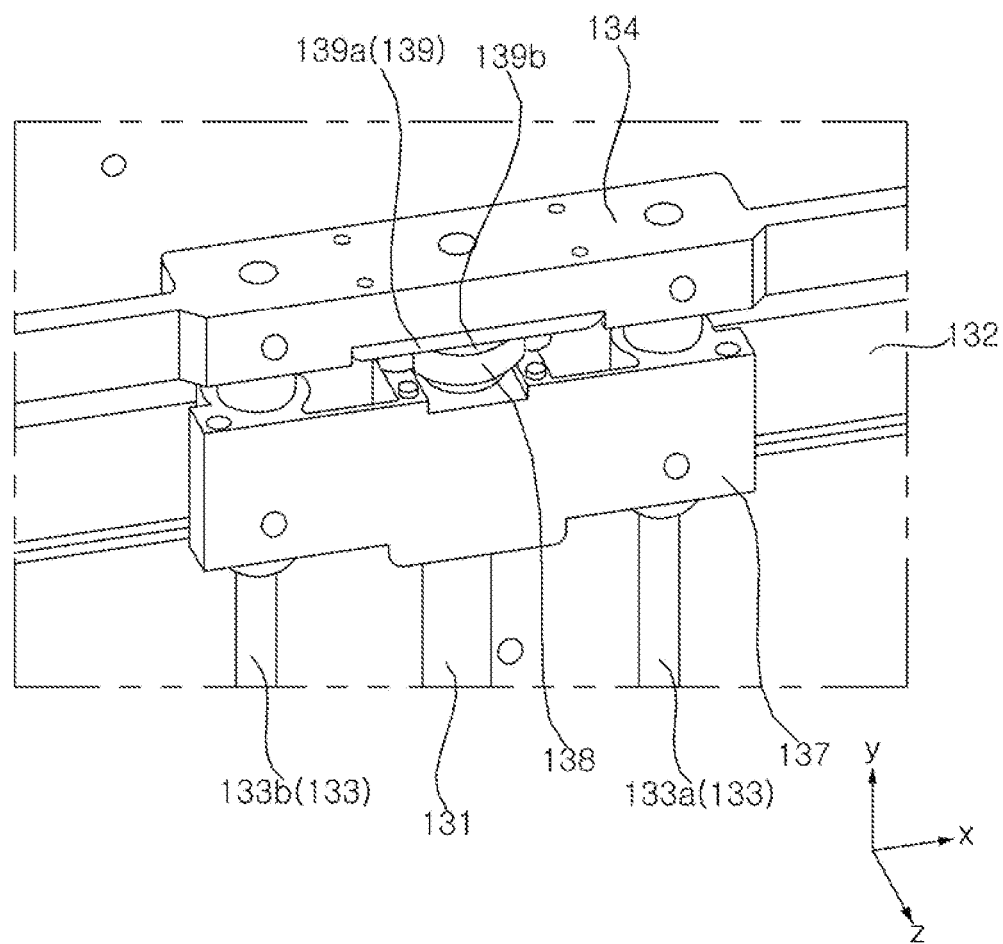

[FIG. 17]
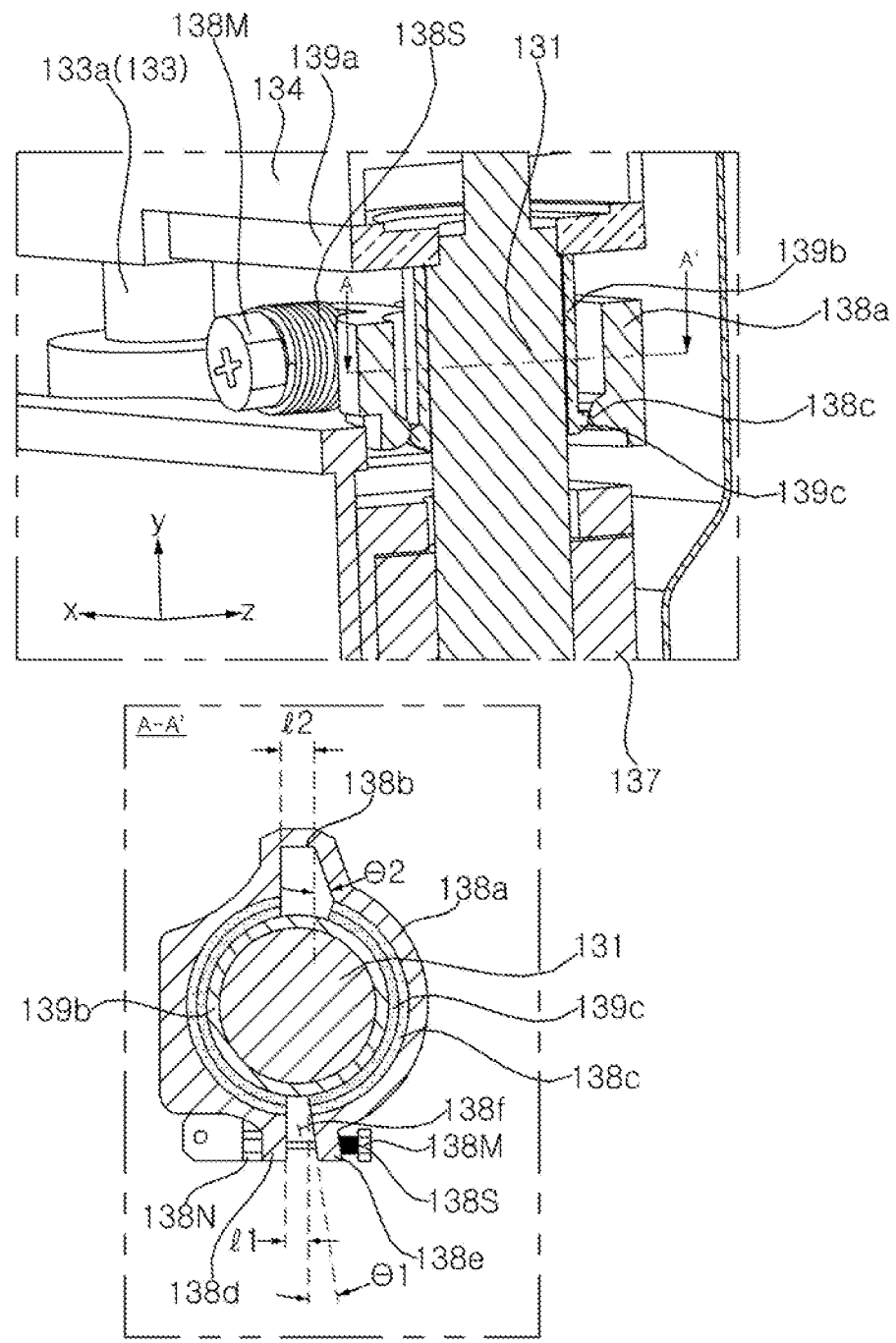

[FIG. 18]
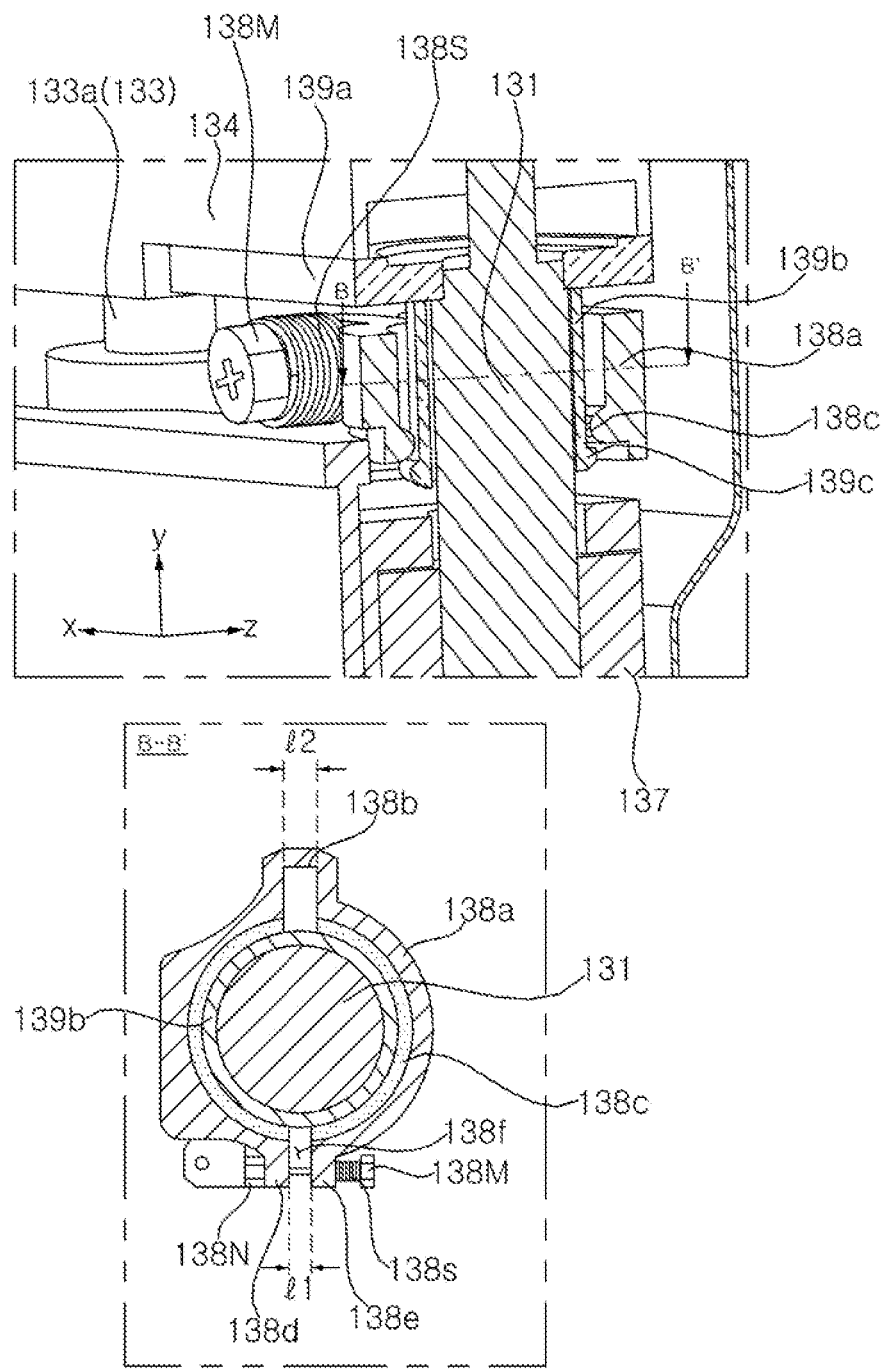

DISPLAY DEVICE

CROSS REFERENCE TO RELATED APPLICATION

This application is the National Phase of PCT International Application No. PCT/KR2020/013588, filed on Oct. 6, 2020, which is hereby expressly incorporated by reference into the present application.

TECHNICAL FIELD

The present disclosure relates to a display device.

BACKGROUND ART

With the development of the information society, there have been growing demands for various types of display devices, and in order to meet these demands, various display devices, such as a liquid crystal display (LCD), a plasma display panel (PDP), an electroluminescent display (ELD), a vacuum fluorescent display (VFD), an organic light emitting diode (OLED), etc., have been studied and used recently.

Among them, the LCD panel includes a TFT substrate and a color substrate which are positioned opposite each other with a liquid crystal layer interposed therebetween, and displays images by using light emitted from a backlight unit. Further, the OLED panel may display images by using a self light-emitting organic layer deposited on a substrate on which transparent electrodes are formed.

Recently, a structure for covering a front surface of a display panel is actively researched.

DISCLOSURE OF INVENTION

Technical Problem

It is an objective of the present disclosure to solve the above and other problems.

It is another objective of the present disclosure to provide a display device capable of covering or opening a front surface of a display panel.

It is yet another objective of the present disclosure to provide a mechanism for stably raising or lowering a cover that covers a front surface of a display panel.

It is yet another objective of the present disclosure to provide a locking structure for holding a raised cover in place without requiring a separate supply of power.

Solution to Problem

According to an aspect of the present disclosure in order to achieve the above objectives, there is provided a display device including: a display panel; a frame to which the display panel is mounted; a cover disposed at a front of the display panel and movably coupled to the frame; and a lift assembly mounted at the frame and configured to move the cover, wherein the lift assembly includes: a lead screw elongated in a moving direction of the cover; a holder adjacent to one end of the lead screw; a slider coupled to the cover and moving along the lead screw when the lead screw rotates; and a fixing ring which is coupled to the slider and through which the lead screw passes, the fixing ring facing the holder in a longitudinal direction of the lead screw, and removably inserted into the holder.

Advantageous Effects of Invention

The display device according to the present disclosure has the following effects.

According to at least one of the embodiments of the present disclosure, a display device capable of covering or opening a front surface of a display panel may be provided.

A mechanism for stably raising or lowering a cover that covers a front surface of a display panel may be provided.

A locking structure for holding a raised cover in place without requiring a separate supply of power may be provided.

Further scope of applicability of the present disclosure will become apparent from the detailed description given hereinafter. However, it should be understood that the detailed description and specific examples, while indicating preferred embodiments of the present disclosure, are given by illustration only, since various changes and modifications within the spirit and scope of the present disclosure will become apparent to those skilled in the art from this detailed description.

BRIEF DESCRIPTION OF DRAWINGS

FIGS. 1 to 18 are diagrams illustrating examples of a display device according to embodiments of the present disclosure.

MODE FOR THE INVENTION

Hereinafter, the present disclosure will be described in detail with reference to the accompanying drawings, in which the same reference numerals are used throughout the drawings to designate the same or similar components, and a redundant description thereof will be omitted.

In general, suffixes such as "module" and "unit" may be used to refer to elements or components. Use of such suffixes herein is merely intended to facilitate description of the specification, and the suffixes do not have any special meaning or function.

It will be noted that a detailed description of known arts will be omitted if it is determined that the detailed description of the known arts can obscure the embodiments of the present disclosure. Further, the accompanying drawings are used to help easily understand various technical features and it should be understood that the embodiments presented herein are not limited by the accompanying drawings. As such, the present disclosure should be construed to extend to any alterations, equivalents and substitutes in addition to those which are particularly set out in the accompanying drawings.

It will be understood that although the terms first, second, etc. may be used herein to describe various elements, these elements should not be limited by these terms. These terms are only used to distinguish one element from another.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

A singular representation may include a plural representation unless context clearly indicates otherwise.

In the following description, even if an embodiment is described with reference to a specific figure, if necessary, reference numeral not shown in the specific figure may be referred to, and reference numeral not shown in the specific figure is used when the reference numeral is shown in the other figures.

Referring to FIG. 1, a display device 100 may include a display panel 11. The display panel 11 may display images.

The display panel 100 may include a first long side LS1, a second long side LS2 opposite to the first long side LS1, a first short side SS1 adjacent to the first long side LS1 and the second long side LS2, and a second short side SS2 opposite to the first short side SS1. For convenience of explanation, it is illustrated and described that the first and second long sides LS1 and LS2 are longer than the first and second short sides SS1 and SS2, but it is also possible that lengths of the first and second long sides LS1 and LS2 may be approximately equal to lengths of the first and second short sides SS1 and SS2.

A direction parallel to the long sides LS1 and LS2 of the display device 100 may be referred to as a first direction DR1 or a left-right direction LR. A direction parallel to the short sides SS1 and SS2 of the display device 1 may be referred to as a second direction DR2 or an up-down direction UD. A direction perpendicular to the long sides LS1 and LS2 and the short sides SS1 and SS2 of the display device 1 may be referred to as a third direction DR3 or a front-rear direction FR. Here, a side on which the display panel 11 displays an image may be referred to as a front side, and a side opposite thereto may be referred to as a rear side.

The first long side LS1 may be referred to as an upper side or an upper surface. The second long side LS2 may be referred to as a lower side or a lower surface. The first short side SS1 may be referred to as a left side or a left surface. The second short side SS2 may be referred to as a right side or a right surface.

The first long side LS1, the second long side LS2, the first short side SS1, and the second short side SS2 may be referred to as edges of the display device 100. Further, positions where the first long side LS1, the second long side LS2, the first short side SS1, and the second short side SS2 meet each other may be referred to as corners.

For example, a position where the first long side LS1 and the first short side SS1 meet each other may be referred to as a first corner C1. A position where the first short side SS1 and the second long side LS2 meet each other may be referred to as a second corner C2. A position where the second long side LS2 and the second short side SS2 meet each other may be referred to as a third corner C2. A position where the second short side SS2 and the first long side LS1 meet each other may be referred to as a fourth corner C4.

For example, the display panel 11 may be an OLED panel. The display panel 11 may divide an image into a plurality of pixels and may output the image while controlling color, brightness, and chroma of the respective pixels. The display panel 11 may be divided into an active area, in which the image is displayed, and a de-active area in which the image is not displayed. The display panel 11 may generate light corresponding to red, green, or blue color in response to a control signal. Meanwhile, the display panel 11 may be provided as various panels such as an LCD and the like.

Referring to FIGS. 1 and 2, a cover 20 may move up and down at the front of the display panel 11.

For example, while moving up, the cover 20 may cover at least a portion of a front surface of the display panel 11. While moving down, the cover 20 may expose the front surface of the display panel 11 to the outside.

In another example, while moving down, the cover 20 may cover at least a portion of the front surface of the display panel 11. While moving up, the cover 20 may expose the front surface of the display panel 11 to the outside.

Meanwhile, the cover 20 may include a metal or fabric material.

Referring to FIG. 3, the display device 100 may include a frame 110. The frame 110 may form the body of the display device 100. The frame 110 may include an outer frame 111, a guide frame 112, an upper frame 113, a middle frame 114, inner frames 115 and 116, and a lower frame 117.

The outer frame 111 may form a periphery of the frame 110, and may have a substantially square frame shape. The outer frame 111 may include a first outer frame 111a forming an upper end of the outer frame 111, a second outer frame 111b forming a lower end of the outer frame 111, a third outer frame 111c forming a left end of the outer frame 111, and a fourth outer frame 111d forming a right end of the outer frame 111.

The guide frame 112 may be disposed between the first outer frame 111a and the lower frame 117 and may be elongated in the up-down direction. The guide frame 112 may include a first guide frame 112a adjacent to the third outer frame 111c and a second guide frame 112b adjacent to the fourth outer frame 111d. The first guide frame 112a may be spaced apart rightward from the third outer frame 111c by a first gap ga. The second guide frame 112b may be spaced apart leftward from the fourth outer frame 111d by a second gap gb. For example, the second gap gb may be equal to the first gap ga.

The upper frame 113 may be disposed between the first guide frame 112a and the second guide frame 112b, and may be elongated in the left-right direction. The upper frame 113 may be coupled to the first guide frame 112a and the second guide frame 112b.

The middle frame 114 may be disposed between the first outer frame 111a and the lower frame 117, and may be elongated in the up-down direction. The middle frame 114 may include a first middle frame 114a and a second middle frame 11b which are coupled to the first outer frame 111a and the lower frame 117 and are spaced apart from each other in the left-right direction.

The inner frames 115 and 116 may be disposed between the upper frame 113 and the lower frame 117 and may be elongated in the left-right direction. The inner frames 115 and 116 may include a pair of first inner frames 115a and 115b which are disposed between the first guide frame 112a and the first middle frame 114a, are coupled to the first guide frame 112a and the first middle frame 114a, and are spaced apart from each other in the up-down direction. The inner frames 115 and 116 may include a pair of second inner frames 116a and 116b which are disposed between the second guide frame 112b and the second middle frame 114b, are coupled to the second guide frame 112b and the second middle frame 114b, and are spaced apart from each other in the up-down direction.

The lower frame 117 may be disposed under the upper frame 113. The lower frame 117 may be disposed between the third outer frame 111c and the fourth outer frame 111d and may be elongated in the left-right direction. The lower frame 117 may be coupled to the third outer frame 111c and the fourth outer frame 111d.

Referring to FIG. 4, the display device 100 may include a cover assembly 120. The cover assembly 120 may include a plate 121 and a bracket 122.

The cover 20 (see FIG. 2) may be coupled to the front surface of the plate 121. For example, the plate 121 may have a plurality of holes 120a, 120b, 120c, 120d, 120e, and 120f formed through the plate 121 in the front-rear direction.

The bracket 122 may be disposed between an upper end 121a and a lower end 121b of the plate 121 and may be coupled to a rear surface of the plate 121. The bracket 122 may be adjacent to the upper end 121a of the plate 121. The bracket 122 may include a first part 1221, a second part 1222, and a third part 1223.

The first part 1221 may form a front surface of the bracket 122 and may be coupled to the rear surface of the plate 121. The second part 1222 may be bent rearward from the first part 1221 and may from a side surface of the bracket 122. The third part 1223 may be bent leftward or rightward from the second part 1222 to face the first part 1221. The third part 1223 may be rearwardly spaced apart from the first part 1221 by a first length dl.

For example, the bracket 122 may include a first bracket 122a adjacent to a left end of the plate 121, and a second bracket 122b adjacent to a right end of the plate 121.

Referring to FIGS. 3 to 5, the cover assembly 120 may be coupled to the frame 110 so as to be movable up and down.

The second part 1222 of the first bracket 122a may be disposed between the third outer frame 111c and the first guide frame 112a. In this case, a thickness to of the second part 1222 may be equal to or smaller than the first gap ga between the third outer frame 111c and the first guide frame 112a. For example, a left surface of the second part 1222 may contact a right surface of the third outer frame 111c.

The third part 1223 of the first bracket 122a may contact the first guide frame 112a at the rear of the first guide frame 112a. The third part 1223 of the first bracket 122a may move up and down while being in contact with the first guide frame 112a.

A display part 10 may include the display panel 11 and a frame 13. Here, the frame 13 may be coupled to the display panel 11 at the rear of the display panel 11. For example, electronic components to be electrically connected to the display panel 11 may be mounted to the frame 13. Meanwhile, the frame 13 may be referred to as a main frame, an inner frame, or a module cover.

The display part 10 may be disposed between the plate 121 and the third part 1223 of the first bracket 122a. For example, the front surface of the display panel 11 may be rearwardly spaced apart from the plate 121, and the rear surface of the frame 13 may be forwardly spaced apart from the third part 1223. In this manner, the cover 20 (see FIG. 2) coupled to the front surface of the plate 121 may cover at least a portion of the front surface of the display panel 11.

Meanwhile, the above description of the first bracket 122a may also apply to the second bracket 122b.

Referring to FIGS. 6 and 7, the display part 10 may be installed in a space defined by the first outer frame 111a, the first guide frame 112a, the upper frame 113, and the second guide frame 112b. In this case, the upper frame 113 may be coupled to the display part 10 at the bottom of the display part 10 to support the load of the display part 10. Further, a total height of the display panel 11 may be h1.

The cover assembly 120 may be disposed under the display part 10. In this case, the entire front surface of the display panel 11 may be exposed forwardly. In addition, the plate 121 may cover a front surface of the second outer frame 111b.

Referring to FIGS. 8 and 9, a lift assembly 130 may be installed on the lower frame 117. Here, FIG. 8 is an enlarged view of region M of FIG. 7. The lift assembly 130 may include a motor 135, a gear box 136a in which a plurality of gears 136 are mounted, a lead screw 131, a slider 137, a rod 133, and a bar 132. In this case, the gear box 136a may be disposed on the lower frame 117.

The motor 135 may provide torque. The motor 135 may be installed on a motor mount 1351. For example, the motor 135 may be disposed above the gear box 136a. In this case, a pole 1352 may be disposed between the motor mount 1351 and the gear box 136a and may extend in the up-down direction to be coupled to the motor mount 1351 and the gear box 136a. Further, a rotating shaft 135a of the motor 135 may be partially inserted into the gear box 136a to provide torque to the plurality of gears 136a. Meanwhile, an encoder 135b may be mounted on the motor 135 to control rotation of the motor 135.

The plurality of gears 136 may include a first gear 1361, a second gear 1362, a third gear 1363, a fourth gear 1364, a fifth gear 1365, and a sixth gear 1366. Rotation of the rotating shaft 135a may be reduced in speed by the plurality of gears 136. For example, a gear reduction ratio of the first gear 1361 to the sixth gear 1366 may be 6 to 8.

The first gear 1361 may be engaged with the rotating shaft 135a. The second gear 1362 may be coupled to a lower surface of the first gear 1361 to rotate together with the first gear 1361. In this case, a diameter of the second gear 1362 may be smaller than a diameter of the first gear 1361. The third gear 1363 may be engaged with the second gear 1362. In this case, a diameter of the third gear 1363 may be greater than the diameter of the second gear 1362. The fourth gear 1364 may be coupled to a lower surface third gear 1363 to rotate together with the third gear 1363. In this case, a diameter of the fourth gear 1364 may be greater than the diameter of the third gear 1363. The fifth gear 1365 may be engaged with the third gear 1363. In this case, a diameter of the fifth gear 1365 may be greater than the diameter of the third gear 1363. A gear (not shown) provided on a rear surface of the fifth gear 1365 may be engaged with the fourth gear. The sixth gear 1366 may be engaged with the gear provided on the lower surface of the fifth gear 1365.

The lead screw 131 may be coupled to the sixth gear 1366 to rotate together with the sixth gear 1366. The lead screw 131 may be elongated in the up-down direction and formed in a generally cylindrical shape and may have a male thread formed on an outer circumferential surface thereof. The lead screw 131 may pass through the slider 137.

The slider 137 may be formed in a generally block shape and may have a hole through which the lead screw 131 passes. In this case, a female thread, engaged with the male thread of the lead screw 131, may be formed at a portion that forms a boundary of the hole. The slider 137 may move in the up-down direction along the lead screw 131.

The rod 133 may pass through the slider 137. The rod 133 may be elongated in the up-down direction and may be fixed to the gear box 136a. While guiding an upward and downward movement of the slider 137, the rod 133 may restrict rotation of the slider 137 about a vertical axis that is parallel to the up-down direction. For example, the rod 133 may include a first rod 133a located on the left side of the lead screw 131 and a second rod 133b located on the right side of the lead screw 131.

The bar 132 may be coupled to a rear surface of the slider 137. The bar 132 may be elongated in the left-right direction to be coupled to the first bracket 122a and the second bracket 122b (see FIG. 7). For example, a fastening member may pass through a hole (not shown) formed in the bar 132 and fastening holes 1224 (see FIG. 4) formed in the third part 1223 of the bracket 122, to be coupled to the bracket 122 and the bar 132.

Accordingly, the slider 137, the bar 132, and the cover assembly 120 may move together in the up-down direction by the rotation of the lead screw 131.

Referring to FIGS. 10 and 11, the cover assembly 120 may cover a portion of the front surface of the display panel 11. For example, a region of the front surface of the display panel 11, which is located at a position corresponding to a second height h2 above the lower end of the display panel 11, may be covered by the cover assembly 120. For example, a region of the front surface of the display panel 11, which is located at a position corresponding to a third height h3 below the upper end of the display panel 11, may be exposed forwardly. In this case, a sum of the second height h2 and the third height h3 equals the total height h1 of the display panel 11.

Referring to FIGS. 12 and 13, the slider 137 may move up along the lead screw 131 to move away from the lower frame 117. Here, FIG. 12 is an enlarged view of region N of FIG. 11.

When the motor 135 is driven such that the lead screw 131 rotates in a first direction, the slider 137 may move up along the lead screw 131. When the motor 135 is driven such that the lead screw 131 rotates in a second direction which is opposite the first direction, the slider 137 may move down along the lead screw 131. In this case, a moving distance of the slider 137 may be controlled by controlling rotation of the motor 135. For example, the motor 135 may be a step motor.

Meanwhile, the bar 143 and the cover assembly 120, which are coupled to the slider 137, may move up and down together with the slider 137, as described above.

A fixing bar 134 may be elongated in the left-right direction. The fixing bar 124 disposed between the first middle frame 114a and the second middle frame 114b may be coupled to the first middle frame 114a and the second middle frame 114b. The fixing bar 124 may be disposed above the lower frame 117. The fixing bar 134 may limit the upward movement of the slider 137, which will be described in further detail below.

Referring to FIG. 14, a fixing ring 138 may be coupled to an upper surface of the slider 137. The fixing ring 138 may have a hole through which the lead screw 131 passes. The fixing ring 138 may have a generally open ring shape. The fixing ring 138 may include a first part 138a, a second part 138b, a third part 138c, a fourth part 138d, and a fifth part 138e. Meanwhile, the fixing ring 138 may be referred to as a clamp.

The first part 138a may have a hole through which the lead screw 131 passes. The first part 138a may have a generally open ring shape which may be split at a first section (or portion) and a second section that are spaced apart from each other.

The second part 138b may connect the split first section of the first part 138a. The second part 138b may protrude in a radial direction of the first part 138a, and may be bent at least once to define a space 138b1 that communicates with the hole of the first part 138a.

The third part 138c may protrude from an inner circumferential surface of the first part 138a. The third part 138c may extend along the inner circumferential surface of the first part 138a. Meanwhile, the third part 138c may form a boundary of a circle having a first diameter D1. In this case, the first diameter D1 may be equal to a width of the third part 138c.

The fourth part 138d may be connected to a first side of the split first portion of the first part 138a, and the fifth part 138e may be connected to a second side of the split first portion of the first part 138a. In this case, the fourth part 138d and the fifth part 138e may be spaced apart from each other such that a space 138f, communicating with the hole of the first part 138a, may be formed between the fourth part 138d and the fifth part 138e.

An elastic member 138S may contact the fifth part 138e. For example, holes (not numbered) may be formed in the fourth part 138d and the fifth part 138e, and a bolt 138M passes through the holes to be fastened to a nut 138N that contacts the fourth part 138d. In this case, the elastic member 138S may be disposed between the fifth part 138e and a head (not numbered) of the bolt 138M. Further, tension applied to the elastic member 138S may be controlled by adjusting a fastening length of the bolt 138M. For example, the elastic member 138S may be a spring.

Referring to FIG. 15, a holder assembly 139 may be coupled to the fixing bar 134. The holder assembly 139 may include a plate 139a coupled to a lower surface of the fixing bar 134, and a holder 139b coupled to a lower surface of the plate 139a. In this case, the lead screw 131 may be inserted into the holder 139b and may be rotatably coupled to the holder 139b. [86] The holder 139b may have a generally cylindrical shape. A protruding portion 139c may protrude from an outer surface of the holder 139b in a radial direction of the holder 139b. Meanwhile, the protruding portion 139c may form a boundary of a circle having a second diameter D2. In this case, the second diameter D2 may be equal to a width of the protruding portion 139c. Further, the second diameter D2 may be greater than the first diameter D1.

Referring to FIGS. 16 to 18, an upward or downward movement of the slider 137 by the rotation of the lead screw 131 may be restricted by the fixing ring 138 inserted into the holder 139b.

Referring to FIG. 17, in response to an upward movement of the slider 137, the third part 138c of the fixing ring 138 may contact the protruding portion 139c of the holder 139b. In this case, when the slider 137 continues to move up, the fixing ring 138 is widened so as to enable the third part 138c to move upward beyond the protruding portion 139c.

Specifically, at a time before the fixing ring 138 is widened, the fifth part 138e of the fixing ring 138 is spaced apart from the fourth part 138d by a first length l1, and a space having a second length l2 as a width may be formed inside the second part 138b. Meanwhile, this state of the fixing ring 138 may be referred to as an original state or a state before deformation.

Further, as the fifth part 138e of the fixing ring 138 moves outwardly from a previous position by a first angle θ1, and a portion of the second part 138b is widened outwardly from the previous position by a second angle θ2, the third part 138c may increase in width. In this case, the elastic member 138S may be compressed. Meanwhile, the second part 138b may be referred to as a deformed portion. Meanwhile, this state of the fixing ring 138 may be referred to as a deformed state.

Referring to FIG. 18, in response to an upward movement of the slider 138, the third part 138c of the fixing ring 138 may move beyond the protruding portion 139c.

Specifically, the fixing ring 138 may return to the state before deformation from the deformed state described above with reference to FIG. 17. In this case, by a restoring force of the elastic member 138S, the fifth part 138e of the fixing ring 138 returns to its original position, so as to be spaced apart from the fourth part 138d by the first length l1, and the second part 138b also returns to its original position such that a space having the second length l2 as a width may be formed therein.

Accordingly, the third part 138c of the fixing ring 138 is stopped by the protruding portion 139c, and thus may be restricted from moving downward. In this case, even when operation of the motor 135 (see FIG. 13) is stopped, the fixing ring 138, the slider 137, the bar 132, and the cover assembly 120 may be held in place. That is, a coupling structure of the fixing ring 138 and the holder 139b may support the load of the cover assembly 120.

Meanwhile, when the motor 135 rotates the lead screw 131 for a downward movement of the slider 137, the fixing ring 138 is widened again as described above, such that the third part 138c may move down beyond the protruding portion 139c. In addition, the fixing ring 138 returns again to the state before deformation, and in response to the rotation of the lead screw 131, the fixing ring 138, the slider 137, the bar 132, and the cover assembly 120 may continue to move down.

According to an aspect of the present disclosure, there is provided a display device including: a display panel; a frame to which the display panel is mounted; a cover disposed at a front of the display panel and movably coupled to the frame; and a lift assembly mounted at the frame and configured to move the cover, wherein the lift assembly includes: a lead screw elongated in a moving direction of the cover; a holder adjacent to one end of the lead screw; a slider coupled to the cover and moving along the lead screw when the lead screw rotates; and a fixing ring which is coupled to the slider and through which the lead screw passes, the fixing ring facing the holder in a longitudinal direction of the lead screw, and removably inserted into the holder.

In addition, according to another aspect of the present disclosure, the display device may further include a cover assembly to which the cover is coupled, wherein the cover assembly may further include: a plate having a front surface to which the cover is coupled; and a bracket coupled to a rear surface of the plate, wherein the lift assembly may further include a bar fixed to the slider and the bracket.

In addition, according to yet another aspect of the present disclosure, the frame may further include a guide frame extending in the longitudinal direction of the lead screw and contacting the bracket.

In addition, according to yet another aspect of the present disclosure, the bracket may further include: a first part coupled to the rear surface of the plate; a second part bent rearward from the first part; and a third part bent leftward or rightward from the second part to face the first part, and contacting the guide frame, wherein the display panel may be disposed between the plate and the third part.

In addition, according to yet another aspect of the present disclosure, the bracket may further include a pair of brackets spaced apart from each other in a left-right direction and fixed to the bar.

In addition, according to yet another aspect of the present disclosure, the lift assembly may further include: a motor mounted at the frame; a plurality of gears connected to a rotating shaft of the motor and the lead screw; and a rod spaced apart from the lead screw and extending in the longitudinal direction of the lead screw to pass through the slider.

In addition, according to yet another aspect of the present disclosure, the lift assembly may further include a fixing bar which is coupled to the frame, and to which the holder is coupled, wherein the lead screw may be rotatably coupled to the holder.

In addition, according to yet another aspect of the present disclosure, the fixing ring may include an elastic material, and may be formed as an open ring such that the fixing ring may be widened to be inserted into the holder.

In addition, according to yet another aspect of the present disclosure, the fixing ring may further include: a first part having a hole through which the lead screw passes, the first part being split at a first section and a second section which are spaced apart from each other; a second part connecting the split first section and protruding from the first part in a radial direction of the first part; a third part protruding from an inner circumferential surface of the first part toward the hole; and a fourth part connected to one side of the split second portion; and a fifth part connected to the other side of the split second portion and spaced apart from the fourth part.

In addition, according to yet another aspect of the present disclosure, the second part may be bent at least once to be elastically deformed.

In addition, according to yet another aspect of the present disclosure, the holder may further include a protruding portion protruding outwardly from the holder, wherein when the fixing ring is inserted into the holder, the third part may rest on the protruding portion.

In addition, according to yet another aspect of the present disclosure, when the fixing ring is inserted into the holder, the slider may be held in place.

In addition, according to yet another aspect of the present disclosure, the cover may gradually cover the front surface of the display panel while moving up, and may gradually expose the front surface of the display panel to an outside while moving down.

Certain embodiments or other embodiments of the disclosure described above are not mutually exclusive or distinct from each other. Any or all elements of the embodiments of the disclosure described above may be combined or combined with each other in configuration or function.

For example, a configuration "A" described in one embodiment of the disclosure and the drawings and a configuration "B" described in another embodiment of the disclosure and the drawings may be combined with each other. Namely, although the combination between the configurations is not directly described, the combination is possible except in the case where it is described that the combination is impossible.

Although embodiments have been described with reference to a number of illustrative embodiments thereof, it should be understood that numerous other modifications and embodiments can be devised by those skilled in the art that will fall within the scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

The invention claimed is:
1. A display device comprising:
a display panel;
a frame to which the display panel is mounted;
a cover disposed at a front of the display panel and movably coupled to the frame; and
a lift assembly mounted at the frame and configured to move the cover,
wherein the lift assembly comprises:
a lead screw elongated in a moving direction of the cover;
a holder adjacent to one end of the lead screw;
a slider coupled to the cover and moving along the lead screw when the lead screw rotates; and a fixing ring which is coupled to the slider and through which the lead screw passes, the fixing ring facing the holder in a longitudinal direction of the lead screw, and removably inserted into the holder.

2. The display device of claim 1, further comprising a cover assembly to which the cover is coupled,
wherein the cover assembly further comprises:
a plate having a front surface to which the cover is coupled; and
a bracket coupled to a rear surface of the plate,
wherein the lift assembly further comprises a bar fixed to the slider and the bracket.

3. The display device of claim 2, wherein the frame further comprises a guide frame extending in the longitudinal direction of the lead screw and contacting the bracket.

4. The display device of claim 3, wherein the bracket further comprises:
a first part coupled to the rear surface of the plate;
a second part bent rearward from the first part; and
a third part bent leftward or rightward from the second part to face the first part, and contacting the guide frame,
wherein the display panel is disposed between the plate and the third part.

5. The display device of claim 4, wherein the bracket further comprises a pair of brackets spaced apart from each other in a left-right direction and fixed to the bar.

6. The display device of claim 1, wherein the lift assembly further comprises:
a motor mounted at the frame;
a plurality of gears connected to a rotating shaft of the motor and the lead screw; and
a rod spaced apart from the lead screw and extending in the longitudinal direction of the lead screw to pass through the slider.

7. The display device of claim 6, wherein the lift assembly further comprises a fixing bar which is coupled to the frame, and to which the holder is coupled,
wherein the lead screw is rotatably coupled to the holder.

8. The display device of claim 1, wherein the fixing ring comprises an elastic material, and is formed as an open ring such that the fixing ring is widened to be inserted into the holder.

9. The display device of claim 8, wherein the fixing ring further comprises:
a first part having a hole through which the lead screw passes, the first part being split at a first section and a second section which are spaced apart from each other;
a second part connecting the split first section and protruding from the first part in a radial direction of the first part;
a third part protruding from an inner circumferential surface of the first part toward the hole; and
a fourth part connected to one side of the split second portion; and
a fifth part connected to the other side of the split second portion and spaced apart from the fourth part.

10. The display device of claim 9, wherein the second part is bent at least once to be elastically deformed.

11. The display device of claim 9, wherein the holder further comprises a protruding portion protruding outwardly from the holder,
wherein when the fixing ring is inserted into the holder, the third part rests on the protruding portion.

12. The display device of claim 11, wherein when the fixing ring is inserted into the holder, the slider is held in place.

13. The display device of claim 1, wherein the cover gradually covers the front surface of the display panel while moving up, and gradually exposes the front surface of the display panel to an outside while moving down.

* * * * *